US012625195B2

(12) United States Patent
Yi et al.

(10) Patent No.: US 12,625,195 B2
(45) Date of Patent: May 12, 2026

(54) MULTI-FUNCTIONAL INTEGRATED TESTING SYSTEM

(71) Applicant: GE Aviation Systems LLC, Grand Rapids, MI (US)

(72) Inventors: Xuan Yi, Niskayuna, NY (US); Cong Li, Clifton Park, NY (US); Han Xiong, Niskayuna, NY (US); Yihe Hua, Clifton Park, NY (US); Karim Younsi, Ballston Lake, NY (US)

(73) Assignee: GE Aviation Systems LLC, Grand Rapids, OH (US)

( * ) Notice: Subject to any disclaimer, the term of this patent is extended or adjusted under 35 U.S.C. 154(b) by 203 days.

(21) Appl. No.: 18/492,193

(22) Filed: Oct. 23, 2023

(65) Prior Publication Data

US 2025/0130290 A1     Apr. 24, 2025

(51) Int. Cl.
*G01R 31/58* (2020.01)

(52) U.S. Cl.
CPC .................................... *G01R 31/58* (2020.01)

(58) Field of Classification Search
CPC ........ G01R 31/50–55; G01R 31/58–60; G01R 29/08–0835
See application file for complete search history.

(56) References Cited

U.S. PATENT DOCUMENTS

| 5,117,191 A | * | 5/1992 | Saigo | ................. | G01R 31/1272 |
| | | | | | 324/544 |
| 5,589,776 A | | 12/1996 | Morant | | |
| 8,775,151 B2 | | 7/2014 | Algaonkar et al. | | |
| 9,459,300 B2 | | 10/2016 | Heiland, Jr. et al. | | |
| 2011/0006802 A1 | * | 1/2011 | Younsi | ................. | G01R 15/185 |
| | | | | | 336/173 |
| 2015/0316590 A1 | | 11/2015 | Eid et al. | | |
| 2016/0069942 A1 | | 3/2016 | Heiland, Jr. et al. | | |
| 2017/0023632 A1 | | 1/2017 | Johnson et al. | | |
| 2019/0120889 A1 | | 4/2019 | Carcia | | |
| 2024/0159800 A1 | * | 5/2024 | Albrecht | ................ | G01R 31/58 |

FOREIGN PATENT DOCUMENTS

| CN | 103207358 B | 2/2016 |
| CN | 112462208 A | 3/2021 |
| CN | 217766696 U | 11/2022 |
| EP | 0302747 A2 | 2/1989 |

* cited by examiner

*Primary Examiner* — Lee E Rodak
*Assistant Examiner* — Demetrius R Pretlow
(74) *Attorney, Agent, or Firm* — Thomas | Horstemeyer, LLP

(57) ABSTRACT

A test system to conduct a sequence of electrical tests of an electrical cable is disclosed. The system includes a testing unit, a set of sensors, and two circuits. The two circuits are switchably coupled to a common voltage source and selectively electrically coupleable to the electric cable to enable the testing unit to conduct a respective test of the electrical cable.

20 Claims, 7 Drawing Sheets

150

152

154

156

MULTI-FUNCTIONAL INTEGRATED TESTING SYSTEM

TECHNICAL FIELD

This disclosure relates generally to testing apparatus, and more specifically to a multi-functional integrated test apparatus for testing conductors.

BACKGROUND

Commercial aircraft and other applications, including industrial, commercial and residential applications, typically include an electrical power distribution system. The electrical power distribution system distributes electricity to loads via electrical cables.

Prior to installation, the electrical cables, or representative samples thereof, are subjected to a range of tests designed to verify that the cables satisfy predetermined performance specifications to meet the operational needs of the application.

DETAILED DESCRIPTION

Figure 1A:
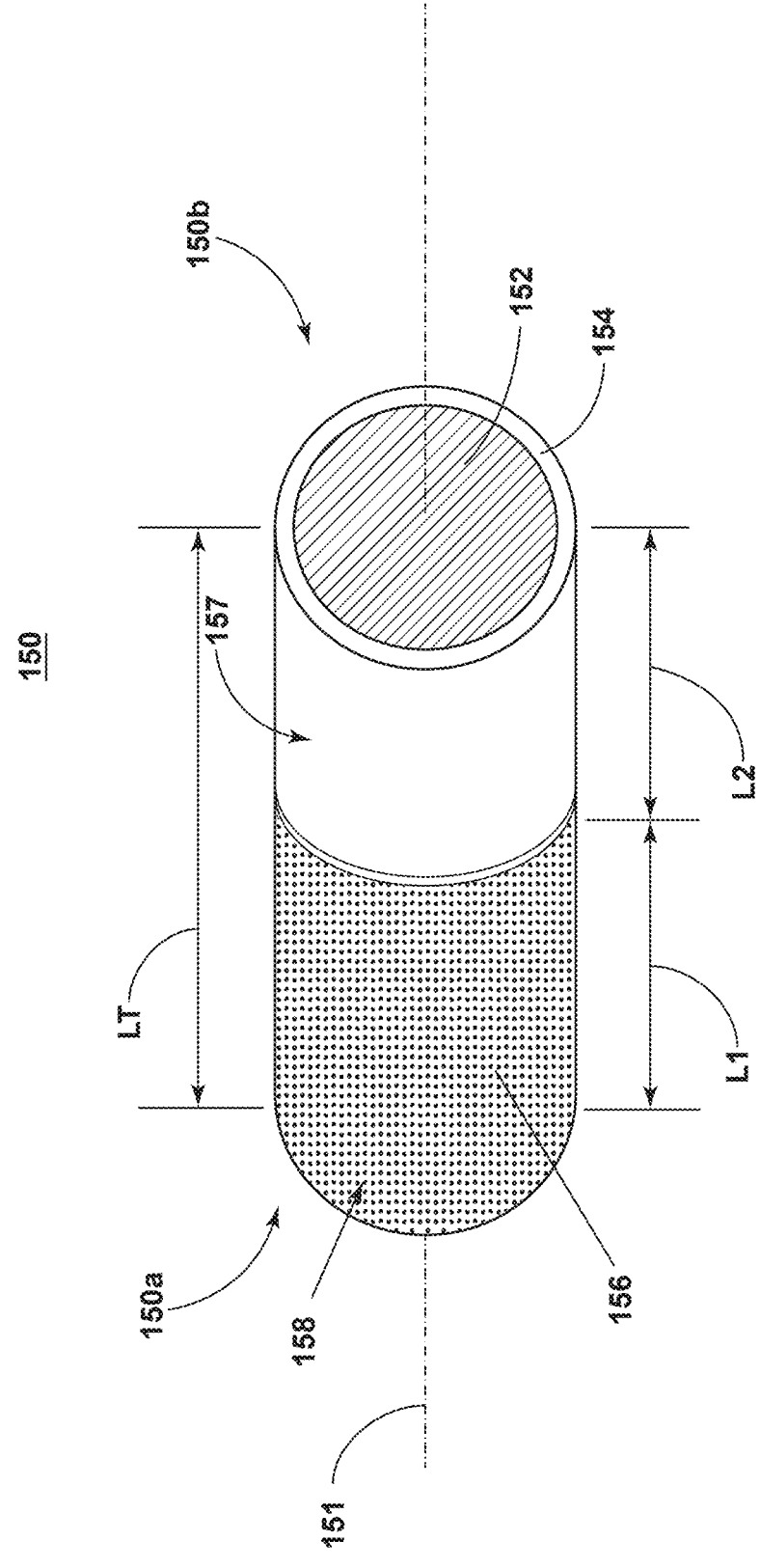
FIG. 1A is a perspective view of an electrical cable.

Aspects of the present disclosure are directed to a testing apparatus and system, and more specifically to a multi-functional integrated test apparatus and system for testing an insulated conductor, such as a cable. For purposes of illustration, the present disclosure will be described with respect to testing an electrical cable. The disclosure can have applicability for testing a variety of electrical conductors, including for example rigid bus bars, and can be used to provide benefits in industrial, commercial, military, and residential applications.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all aspects described herein should be considered exemplary.

As used herein, the terms "first," "second," and "third" and the like, can be used interchangeably to distinguish one component from another and are not intended to signify location or importance of the individual components. The singular forms "a", "an", and "the" include plural references unless the context clearly dictates otherwise. Furthermore, as used herein, the term "set" or a "set" of elements can be any number of elements, including only one. All directional references (e.g., radial, axial, proximal, distal, upper, lower, upward, downward, left, right, lateral, front, back, top, bottom, above, below, vertical, horizontal, clockwise, counterclockwise, upstream, downstream, aft, etc.) are only used for identification purposes to aid the reader's understanding of the present disclosure, and do not create limitations, particularly as to the position, orientation, or use of the present disclosure.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other.

As used herein, elements being "electrically connected," "electrically coupled," or "in signal communication" include an electric transmission or signal being sent, received, or communicated to or from such connected or coupled elements. Furthermore, such electrical connections or couplings can include a wired or wireless connection, or a combination thereof. In non-limiting examples, connections or disconnections can be selectively configured to provide, enable, disable, or the like, an electrical connection between respective elements. Non-limiting example electrical connections or disconnections can be enabled or operated by way of switching, bus tie logic, or any other connectors configured to enable or disable the energizing of an electrical load downstream of the connection. Additionally, while terms such as "voltage", "current", and "power" can be used herein, it will be evident to one skilled in the art that these terms can be interrelated when describing aspects of the electrical circuit, or circuit operations.

As used herein, a controllable switching element, or a "switch" is an electrical device that can be controllable to operate or toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

As used herein, the term "conductivity" refers to a property of a material that allows a flow of charge or electric current therethrough. Also as used herein, the term "electrical conductor" refers to a material that exhibits a relatively high electrical conductivity (for example, greater than about 10-7 siemens per meter (S/m)). Unless stated otherwise, as used herein, the term "conductive" refers to electrical conductivity, and the term "conductor" refers to an electrical conductor.

As used herein, the term "electrically insulative" refers to a property of a material that resists a flow of charge or electric current therethrough Also as used herein, the term "electrical insulator" refers to a material that exhibits a low electrical conductivity (for example, less than about 10-8 siemens per meter (S/m)). Unless stated otherwise, as used herein, the term "insulative" refers to electrical insulation, and the term "insulator" refers to an electrical insulator.

As used herein, the term "ground" or "electrical ground", or "system ground" refers to a reference point in an electrical circuit from which voltages can be measured or referenced. As used herein a "ground" will provide a common return path for electric current. It will be appreciated that elements coupled to electrical ground via a resistive element or impedance are considered electrically isolated with respect to electrical ground.

As used herein, a "controller", for example, "control module", includes a component configured or adapted to provide instruction, control, operation, or any form of communication for operable components to affect the operation thereof. Such controllers or modules can include any known processor, microcontroller, or logic device, including, but not limited to: Field Programmable Gate Arrays (FPGA), a Complex Programmable Logic Device (CPLD), an Application-Specific Integrated Circuit (ASIC), a Full Authority Digital Engine Control (FADEC), a Proportional Controller (P), a Proportional Integral Controller (PI), a Proportional Derivative Controller (PD), a Proportional Integral Derivative Controller (PID), a hardware-accelerated logic controller (e.g. for encoding, decoding, transcoding, etc.), the like, or a combination thereof. While described herein as comprising separate elements, in non-limiting aspects such controllers and modules can be incorporated on one or more devices including a common device, such as a single processor or microcontroller. Non-limiting examples of such controllers or module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module, regulator module, or integrator module can also include a data storage component accessible by the processor, including memory, whether transition, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, Universal Serial Bus (USB) drives, the like, or any suitable combination of these types of memory. In one example, the program code can be stored within the memory in a machine-readable format accessible by the processor.

Additionally, the memory can store various data, data types, sensed or measured data values, inputs, generated or processed data, or the like, accessible by the processor in providing instruction, control, or operation to affect a functional or operable outcome, as described herein. In another non-limiting example, a control module can include comparing a first value with a second value, and operating or controlling operations of additional components based on the satisfying of that comparison. For example, when a sensed, measured, or provided value is compared with another value, including a stored or predetermined value, the satisfaction of that comparison can result in actions, functions, or operations controllable by the controller module. As used herein, the term "satisfies" or "satisfaction" of the comparison means that the first value satisfies the second value, such as being equal to or less than the second value, or being within the value range of the second value. It will be understood that such a determination may easily be altered to be satisfied by a positive/negative comparison or a true/false comparison. Example comparisons can include comparing a sensed or measured value to a predetermined threshold value or threshold value range.

Also, as used herein, sensors can be described as "sensing", "monitoring" or "measuring" a respective value. As used herein, the sensing, monitoring, or measuring includes determining a value indicative of, or related to, the respective value, rather than directly sensing or measuring the respective value itself. The sensed, monitored, or measured values can further be provided to additional components. For instance, a signal indicative of a particular sensed, monitored, or measured value can be provided to a controller module or processor, and the controller module or processor can perform processing based on the signal to determine a representative value or an electrical characteristic representative of said value.

Electrical cables are typically subject to acceptance testing by users and manufacturers to verify the electrical cable meets predetermined performance requirements. For example, typical acceptance tests of an electrical cable can include temperature rise tests, partial discharge (PD) tests, and electromagnetic interference (EMI) tests. Each of the tests typically comprise subjecting the electrical cable (i.e., the cable under test) to predetermined electrical (voltage, current, etc) and/or environmental (e.g., atmospheric pressure, temperature, etc.) conditions, and measuring performance characteristics of the cable (e.g., temperature, voltage, current, etc.). The measured performance characteristics can be compared to predetermined thresholds. The tests can be performed in accordance with commercial, industry, or military standards to determine acceptability of the electrical cable. Additionally, or alternatively, the tests can be customized, for example based on particular performance needs of an application.

An electrical conductor (e.g., an electrical cable) that is charged to a non-zero potential or that conducts an electrical current acts as an antenna that provides energy, or radiated emissions, into the surrounding environment in the form of near-field electric and magnetic fields (E fields and M fields) and far-field electromagnetic fields (EM fields). Energy from these radiated emissions can couple onto other nearby conductors and radiate into the environment. The energy can typically be either radiated or conducted as electrical noise or electromagnetic interference (EMI) and can disrupt the proper operation of connected and nearby equipment. While electrical insulation (e.g., an electrically insulative layer) on or surrounding electrical cables can protect the cable mechanically from abrasion and environmentally from moisture, the electrical insulation is transparent to electromagnetic energy and offers no protection or shielding from EMI. Accordingly, conventional power distribution circuits often use so called "shielded cables", or "sheathed cables". The shielded cables typically have a central signal-carrying primary conductor or conductive element disposed within or surrounded by an electrically insulative layer, and further surrounded by an EMI shielding layer to reduce the effects of EMI. Typically, the shielding layer is electrically conductive and surrounds the insulated primary conductor and can reduce the EMI by reflecting the energy, conducting it to ground, or both.

Conventional shielded cables typically employ a foil shield, a braided (or mesh) electrically conductive shield, or a combination thereof. Foil shielding is typically a thin layer of a conductor (e.g., aluminum), attached to an insulative carrier (e.g., polyester), and circumferentially surrounds the electrically insulative layer surrounding the primary conductor or wire. Braided conductive shielding is typically a woven mesh formed as a tubular sheath of bare or tinned copper wires that provides a low-impedance path (e.g., short-circuit) to ground. In some cases, an unshielded insulated cable can be routed through a braided conductive sheath or screen, which can act as an EMI shield. In some instances, multiple alternating electrically insulating layers and shielding layers can circumferentially surround the primary conductor.

An EMI test, such as a conducted emissions test, of a shielded electrical cable can provide an indication of the shielding effectiveness of the electrical cable. The conducted emission test typically includes supplying a predetermined electrical current over a predetermined frequency range (e.g., 9 kHz-300 MHz) through the primary conductor of the electrical cable under test, and detecting unwanted electromagnetic signals emitted from the primary conductor (e.g., conducted emissions), for example by detecting an induced electrical current in the shield in the conductive shield of the electrical cable. Depending on the test standard or protocol applied, the induced electrical current can be measured in microamperes (uA), and conventionally expressed with respect to the frequency spectrum as a logarithmic expression (e.g., dBuA). In some instances, the conducted emissions are detected as a voltage (e.g., in microvolts (uV), and conventionally expressed with respect to the frequency spectrum as a logarithmic expression (e.g., dBuV).

Typical conducted emissions test equipment or test modules includes a power source (e.g., a voltage source or function generator and amplifier), an EMI receiver (e.g., a spectrum analyzer), a line impedance stabilization network (LISN), an isolation transformer, an RF cable and a grounding cable having a predetermined termination impedance (e.g., 50 ohms). In some cases, the EMI receiver can include a current sensor. The test module typically further includes suitable testing software and automatic data acquisition modules arranged to conduct a variety of automatic conducted emission tests. A conventional conducted emissions test can include providing a current from the power source to the primary conductor of the electrical cable under test, and conducting a scan using the software and EMI receiver to measure peak and average values of electromagnetic signals (e.g., a voltage, and/or a current) detected on the shield of the electrical cable under test. The detected peak and average values of the electromagnetic signals are compared to predetermined limits or thresholds specified in the test standard or protocol.

Partial discharge is a failure of an electrical insulator associated with a conductor to withstand an electrical field applied to it. The result of the failure is a high-frequency, uni-polar discharge that only partly bridges the insulation between the conductor with an accompanying electrical current pulse through and on the insulation from the conductor to ground. The current pulse is of relatively short (e.g., microsecond) duration and low energy, but causes degradation of the electrical insulation. For example, the discharge can erode the insulation internally through heat and ionization. In some instances, the discharge occurs on the surface of the insulator, which can cause the breakdown of air molecules into oxygen (ozone) and nitrogen (nitric oxide). The nitric oxide forms nitric acid, which erodes the insulation from the outside.

In the context of a shielded insulated electrical cable, a partial discharge can partly bridge the electrically insulative layer between the primary conductor and the conductive shield. In the event a partial discharge current pulse is present in the insulative layer of the electrical cable, a set of radio frequency current pulses of equal magnitude but opposite polarity are conducted on the primary conductor and the conductive shield. The current pulses are typically relatively high frequency (e.g., megahertz) and relatively small magnitude (e.g., milliamps). A partial discharge test of an insulated shielded conductor can verify that the cable insulation is free from partial discharges at a specified voltage magnitude at a specified frequency.

Conventional PD test procedures and general evaluation guidelines are commonly provided in various industry and military standards. Partial discharge testing of an insulated shielded electrical cable typically includes grounding the conductive shield (e.g., an outer conductive shield) of the electrical cable and applying a test voltage to the primary conductor of the electrical cable. The test voltage magnitude and frequency can be varied over time. The typical partial discharge test also includes directly or indirectly measuring any discharge current pulses that may occur in the conductive shield due to a dielectric breakdown of the electrically insulative layer between the primary conductor and the conductive shield of the electrical cable. For example, in some instances, a partial discharge event can be inferred by detecting a discharge current in the conductive shield of the cable under test, at various test voltage levels or frequencies. During such a PD test, the test voltage is applied to the primary conductor of the electrical cable under test and any partial discharge pulses are detected on the shield using a current sensor (e.g., a High Frequency Current Transformer (HFCT) or Radio Frequency Current Transformer (RFCT)) and a partial discharge measuring device (e.g., a spectrum analyzer and/or an oscilloscope). A respective waveform or signature of any discharge currents in the conductive shield of the electrical cable can be determined at various test voltage and frequency levels.

In other instances, the partial discharge current pulse can be inferred or determined based on a measured voltage drop in the test voltage when the discharge occurs. In such cases, a conventional pulse generator is typically used to calibrate the test system by relating a measured voltage drop to a pico-coulomb amount.

A conventional PD test module includes a variable voltage source (e.g., a pulse generator and an amplifier), one or more current sensors (e.g., an HFCT or RFCT), a partial discharge measuring device, (e.g., an oscilloscope and spectrum analyzer). The PD test module typically further includes suitable testing software and automatic data acquisition modules arranged to conduct one or more PD tests. A conventional PD test typically includes a scan carried out using the software and partial discharge detector to characterize waveform signatures of any discharge current in the primary conductor or the shield of the cable under test, or both. The waveform signatures are analyzed and compared to predetermined limits or thresholds specified in a test standard or protocol.

The electrical resistance of an electrical cable is the inverse of its conductivity and can be based primarily on the material (e.g., copper, aluminum, etc.) and the cross-sectional area (e.g., wire gauge) of the electrical cable. The electrical resistance will decrease in direct proportion to the cross-sectional area of the electrical cable. In operation, when conducting an electrical current, a temperature of the electrical cable will increase due to its electrical resistance. The magnitude of the increase in temperature will be proportional to a product of the electrical resistance of the cable and the square of the magnitude of the electrical current flowing through it.

Conventional electrical cables have predetermined temperature and ampacity ratings. The ampacity rating is typically a maximum current that the cable can conduct continuously under predefined conditions (e.g., atmospheric pressure, ambient temperature, etc.) without exceeding its temperature rating. The temperature rating of a cable is typically considered the maximum temperature that the cable can reach (e.g., without insulation melting, oxidizing, or self-igniting) when carrying an electrical current at its rated ampacity. The temperature rating is typically based on the type of insulation and/or sheathing used in the construction of the electrical cable. For example, some conventional cables are commonly rated from 40 degrees Celsius (° C.) to 105° C.

Temperature rise testing is typically performed to verify an electrical cable can satisfy a predetermined temperature rating and/or ampacity. A conventional temperature rise test supplies a predetermined electrical test current through the primary conductor of a particular electrical cable under test, and measures the rise in temperature (e.g., over ambient temperature), at one or more predetermined locations along the electrical cable. For example, depending on the test standard or protocol applied, the temperature rise may be in the range of about 50° C. to about 105° C. In other instances, such as for specialized cables, the temperature range can be higher. In some cases, the temperature test can be conducted at a relatively low voltage (e.g., about 5 V) that is lower than a rated voltage of the electrical cable under test.

Typically, temperature rise test equipment can be arranged as a test module that includes a power source (e.g., a voltage source and/or a current source), a current sensor (e.g., a current transformer), and a set of temperature sensors (e.g., thermocouples). The temperature rise test module typically further includes suitable testing software and automatic data acquisition modules arranged to conduct a variety of temperature rise. A conventional temperature rise test can include supplying, from the power source, an electrical test current at a predetermined magnitude and frequency (e.g., 300 A, 2 kHz) to the primary conductor of the electrical cable under test, and continuously or periodically sensing or measuring a respective temperature of the ambient environment and at one or more locations along the electrical cable under test over a predetermined period or until a stabilized temperature of the electrical cable under test is reached. A maximum measured temperature of the electrical cable under test is compared to an ambient temperature to determine a temperature rise value, and the temperature rise value is compared to predetermined limits or thresholds specified in the test standard or protocol.

Acceptance testing as discussed hereinabove by way of example (e.g., EMI, PD, and temperature rise tests) are typically conducted independently of each other using conventional test equipment or instruments designed specifically to perform the particular test (e.g., an EMI test module, a partial discharge test module, a temperature test module, etc.), or can be conducted using generic electrical equipment (e.g., power supplies, oscilloscopes, meters, current transformers, sensors, and the like). However, each specific test type requires particular respective electrical circuits and coupling arrangements of the cable under test with the respective test equipment. As the number of acceptance tests increases, it becomes increasingly time consuming to reconfigure the test equipment and the cable under test in accordance with the specific arrangement required for each test. Aspects as disclosed herein provide a multifunctional testing system and apparatus for conducting a number of different tests of an electrical cable without need to reconfigure the test equipment and cable under test. Aspects as disclosed herein can simplify the testing process for electrical cables. One benefit of the aspects as disclosed herein is that the time and effort required to set-up and conduct a plurality of different electrical tests of an electrical cable is reduced from conventional arrangements.

While aspects of the disclosure will be described herein by way of example and for ease of description and understanding, in terms of EMI, PD, and temperature rise or ampacity tests, aspects are not so limited, and aspects can be used to conduct other types or numbers of tests as desired.

Reference will now be made in detail to present aspects of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

Figure 1B:
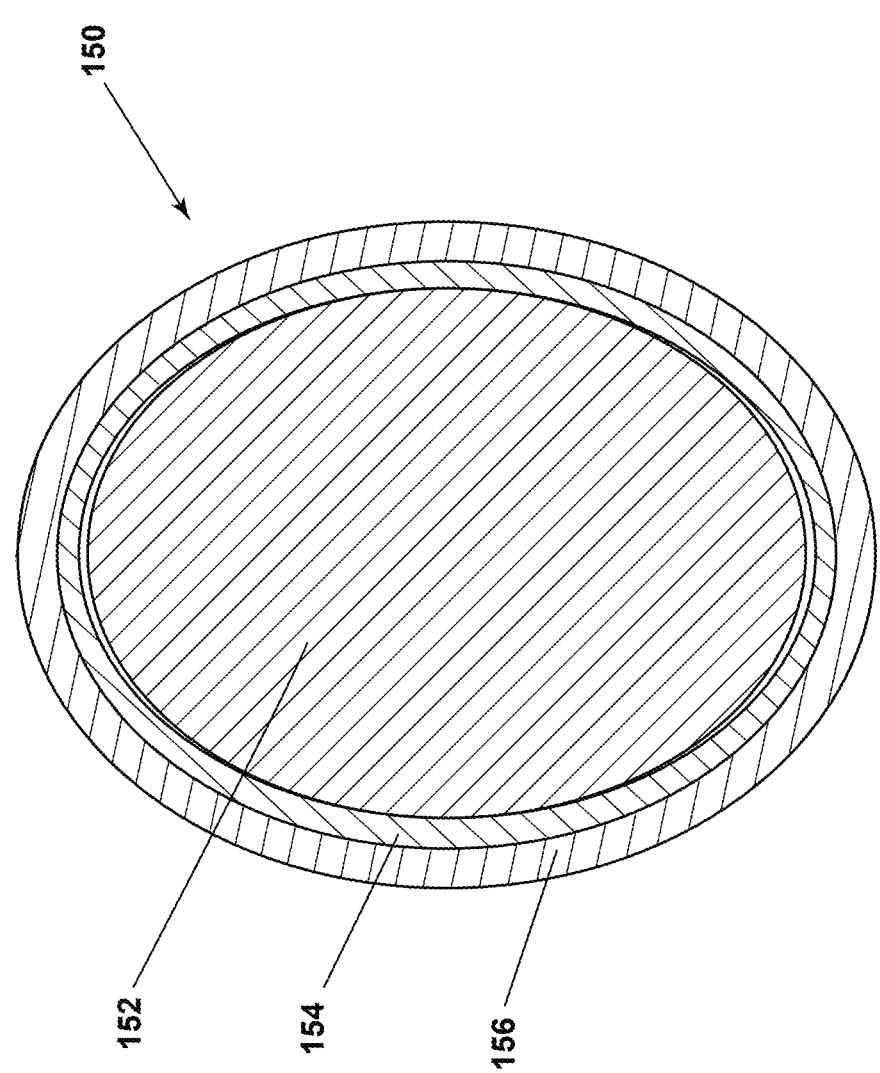
FIG. 1B is a cross-section of the electrical cable of FIG. 1A.

FIG. 1A depicts an isometric view of an electrical cable 150 to be tested, and FIG. 1B illustrates a cross-section of a portion of the electrical cable 150 of FIG. 1A. With simultaneous reference to FIGS. 1A and 1B, the electrical cable 150 has a longitudinal axis 151, and extending from a diametric first end 150a to a diametric second end 150b, to define a total length LT of the electrical cable 150. The electrical cable 150 can include an elongate central electrically conductive element 152 (e.g., a copper wire), or primary conductor, circumscribed by a first electrically insulative layer 154. The first electrically insulative layer 154 can be circumferentially surrounded by a first electrically conductive shield 156 (e.g., a sheath, a woven braid, etc.). The first electrically conductive shield 156 can define a shielded portion 158 of the electrical cable 150. For example, the first electrically conductive shield 156 can extend longitudinally along a first length L1 of the electrical cable 150 that is less than the total length LT of the electrical cable 150 to define the shielded portion 158. A second length L2 of the electrical cable 150 at the second end 150b can exclude the first electrically conductive shield 156 to define an unshielded portion 157 of the electrical cable 150. The central electrically conductive element 152 at the first end 150a (e.g., at the shielded portion 158) can be electrically coupleable, for example via a lug or connector (not shown), to the second end 150b (e.g., at the unshielded portion 157, to define a conductive loop or annular arrangement (not shown) of the central electrically conductive element 152.

Figure 1C:
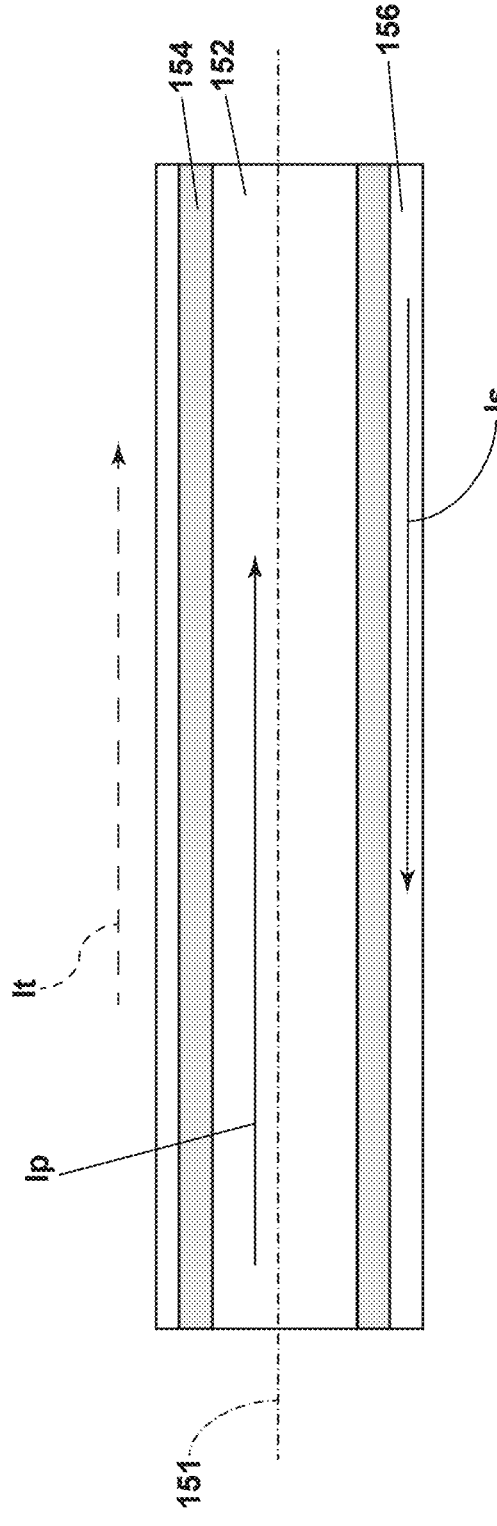
FIG. 1C is a schematic view of a cross-section of a shielded portion of the electrical cable of FIG. 1A.

FIG. 1C is schematic view of a cross-section of the shielded portion 158 of the electrical cable 150 of FIG. 1A. As illustrated, a primary electrical current (depicted as arrow "Ip") can operatively be supplied or injected to flow in a first direction (e.g., from left to right when viewing the page) in the central electrically conductive element 152. Due to the effects of radiated electromagnetic fields, or a partial discharge in the first electrically insulative layer 154, a secondary electrical current (depicted as arrow "Is"), having a magnitude less than the primary electrical current Ip, can be induced to flow in a second direction (e.g., from right to left when viewing the page) opposite the first direction, in the first electrically conductive shield 156. A total electrical current (depicted as dashed arrow "It") can be measured using a conventional current transformer type current sensor (not shown). Due to the opposing directions of the primary electrical current Ip and the secondary electrical current It, the measured total electrical current It can be indicative of a difference in magnitude between the primary electrical current Ip and the secondary electrical current It.

Figures 1D, 1E, 1F:
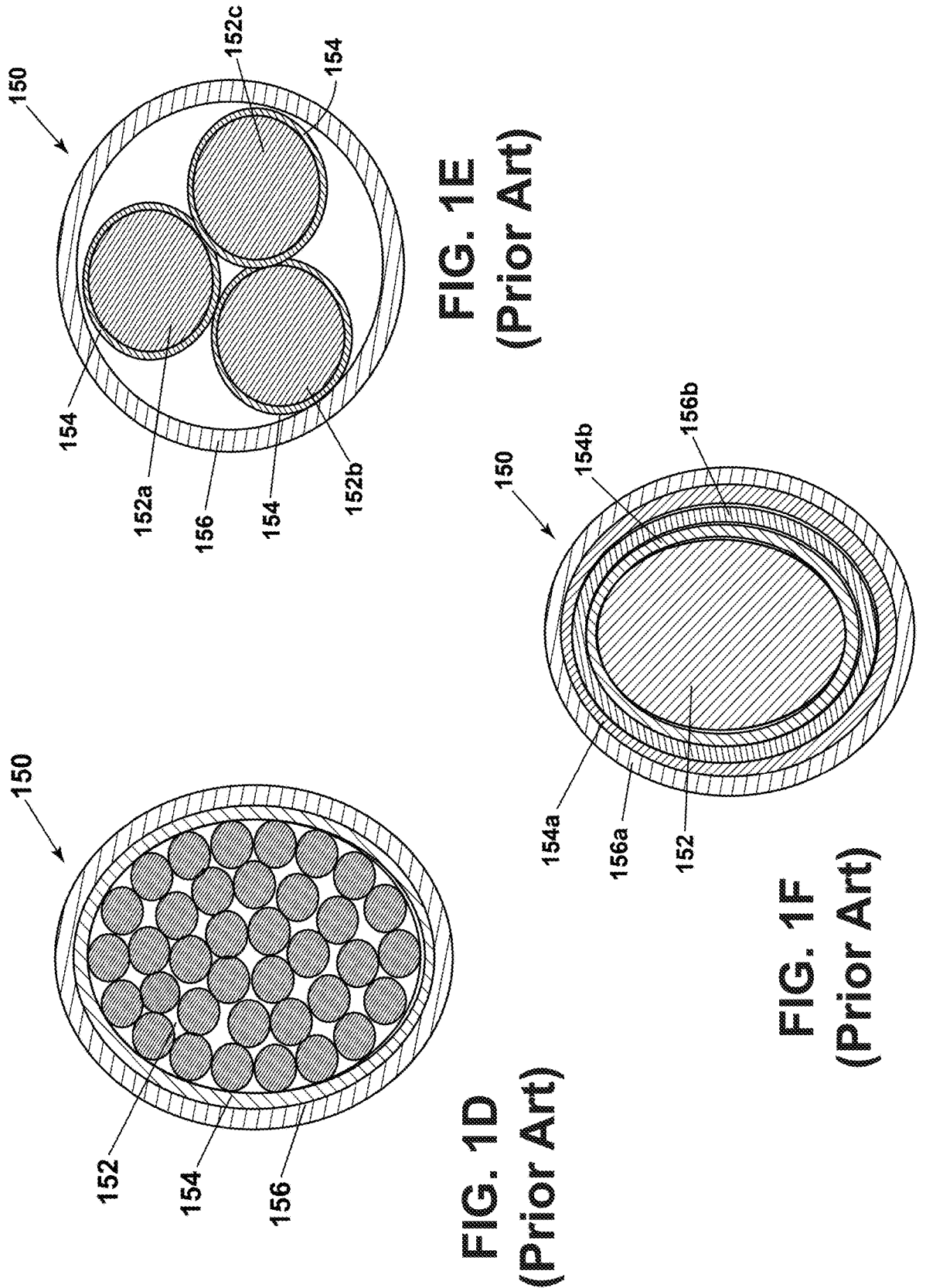
FIG. 1D a cross-section of another aspect of the electrical cable of FIG. 1A.
FIG. 1E a cross-section of still another aspect of the electrical cable of FIG. 1A.
FIG. 1F a cross-section of still another aspect of the electrical cable of FIG. 1A.

While FIG. 1A-1C depict, for ease of description and understanding, one non-limiting example of an electrical cable 150 having a central electrically conductive element 152 that is a single conductor (e.g., a wire), other aspects are not so limited. For example, FIG. 1D depicts another instance of a cross-section of the electrical cable 150 to be tested. The electrical cable 150 of FIG. 1C differs from the electrical cable 150 of FIG. 1B in that the central electrically conductive element 152 of FIG. 1D includes a set of conductors (e.g., a stranded conductor).

As another example, FIG. 1E depicts still another instance of a cross-section of the electrical cable 150 to be tested. The electrical cable 150 of FIG. 1E differs from the electrical cable 150 of FIG. 1B in that the central electrically conductive element 152 of FIG. 1E includes a set of electrically conductive elements 152a, 152b, 152c. Each of the electrically conductive elements 152a, 152b, 152c can be surrounded by a respective first electrically insulative layer 154. The first electrically conductive shield 156 surrounds each of the electrically conductive elements 152a, 152b, 152c and respective first electrically insulative layers 154.

In still other instances, the electrical cable 150 can include a plurality of insulative layers and electrically conductive shields. As depicted in FIG. 1F, a cross-section of another instance of the electrical cable 150 having more than one insulative layer and more than one conductive shield is shown. The central electrically conductive element 152 is surrounded by first electrically insulative layer 154a. The first electrically insulative layer 154a can be circumferentially surrounded by the first electrically conductive shield 156. However, the electrical cable 150 of FIG. 1F differs from the electrical cable 150 of FIG. 1C in that a radially inner or second electrically conductive shield 156b is disposed between the first electrically insulative layer 154a and the central electrically conductive element 152. Additionally, a radially inner or second electrically insulative layer 154b is disposed between the second electrically conductive shield 156b and the central electrically conductive element 152, and further arranged to circumferentially surround the central electrically conductive element 152. The first electrically insulative layer 154a circumferentially surrounds the second electrically insulative layer 154b and the second electrically conductive shield 156b. The second electrically conductive shield 156b can circumferentially surrounds the second electrically insulative layer 154b.

Figure 1G:
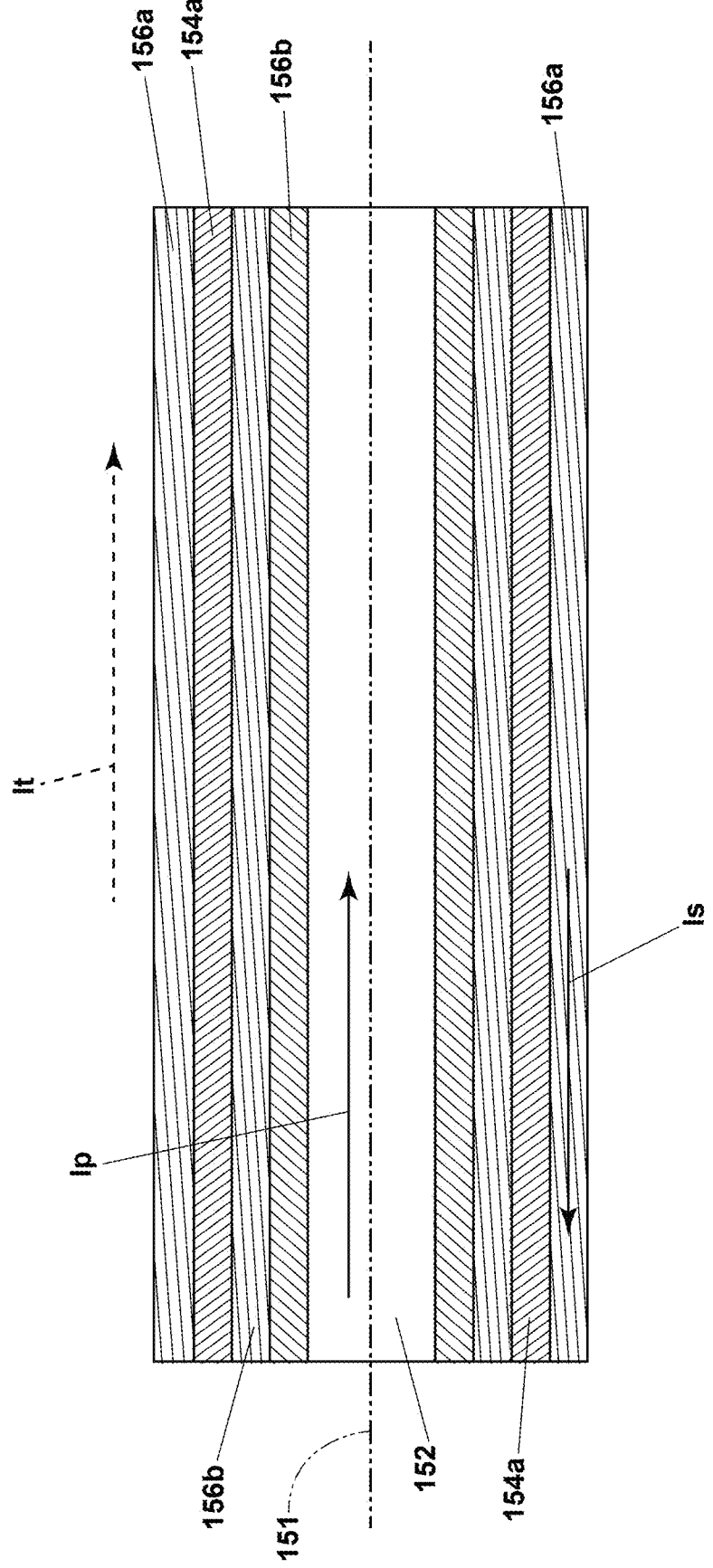
FIG. 1G is a schematic view of a cross-section of a shielded portion of the electrical cable of FIG. 1F.

FIG. 1G is schematic view of a cross-section of the shielded portion 158 of the electrical cable 150 of FIG. 1F. As illustrated, the primary electrical current Ip can operatively be supplied or injected to flow in the first direction (e.g., from left to right when viewing the page) in the central electrically conductive element 152. Due to the effects of radiated electromagnetic fields, or a partial discharge in the first electrically insulative layer 154a and/or the second electrically insulative layer 154b, the secondary electrical current Is, having a magnitude less than the primary electrical current Ip, can be induced to flow in the second direction (e.g., from right to left when viewing the page) opposite the first direction, in the first electrically conductive shield 156. The total electrical current It can be measured using a conventional current transformer type current sensor (not shown). Due to the opposing directions of the primary electrical current Ip and the secondary electrical current It, the measured total electrical current It can be indicative of a difference in magnitude between the primary electrical current Ip and the secondary electrical current It.

It will be appreciated that while FIGS. 1A-1F depict, for ease of description and understanding, the central electrically conductive element 152 as having a generally circular cross section, other aspects are not so limited. In various instances, the central electrically conductive element 152 can have any desired cross section including for example, oval, rectangular and polygonal, without departing from the scope of the disclosure. Additionally, while aspects are discussed herein with respect to testing electrical cables, other aspects are not so limited. It is contemplated that aspects as disclosed herein can be arranged to test other electrical conductors such as bus bars and other rigid conductors without departing from the scope of the disclosure.

Figure 2:
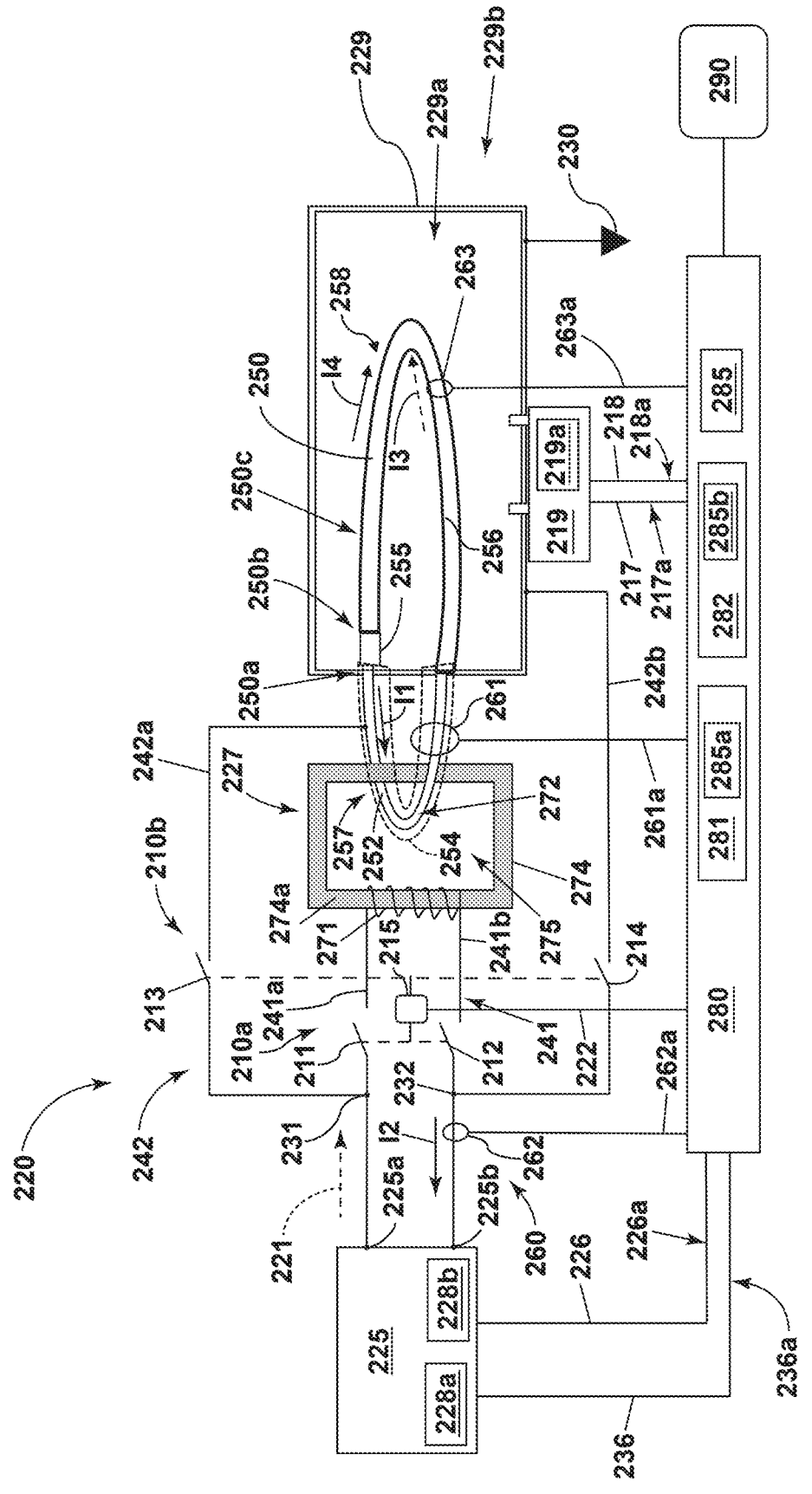
FIG. 2 is a schematic diagram of a testing system in accordance with aspects as described herein.

FIG. 2 depicts an exemplary test system 220 in accordance with a non-limiting aspect. For ease of description and understanding, unless otherwise noted herein, the exemplary test system of FIG. 2 is described with reference to the electrical cable 150 of FIG. 1A, with reference numbers incremented by 100. The test system 220 is arranged to test an electrical cable 250. In non-limiting aspects, the electrical cable 250 can comprise the electrical cable 150 of any of FIG. 1A-1F. The electrical cable 250 can be a conventional insulated shielded electrically conductive cable or wire. For example, in one non-limiting aspect, the electrical cable 250 can comprise a M27500 Component Wire SAE WC27500 cable. In other non-limiting aspects, the first electrically insulative layer 254 (shown as dashed line in FIG. 2) of the electrical cable 250 can comprise any desired electrical insulation or dielectric material without departing from the scope of the disclosure. The first electrically conductive shield 256 can circumscribe at least a portion of the first electrically insulative layer 254. In non-limiting aspects, the electrical cable 250 can comprise any desired size (e.g., American Wire gauge (AWG)) cable, and can range, for example, from 0000 AWG to 26 AWG. In some non-limiting aspects, the central electrically conductive element 252 can be a single strand conductor. In other non-limiting aspects, the electrically conductive element 252 can comprise a multiple strand conductor, each strand having any desired size without departing from the scope of the disclosure.

The test system 220 can include a voltage source 225. For example, in non-limiting aspects, the voltage source can include a signal generator 228a communicatively coupled to an amplifier 228b. The signal generator 228a can provide a voltage to the amplifier 228b. The amplifier 228b can be configured to selectively modify the voltage from the signal generator 228a to define the first voltage signal 221. The first voltage signal 221 can have or be defined by a value such as a magnitude, a frequency, a waveform, and the like. The voltage source 225 can include a first output terminal 225a and a second output terminal 225b. The first output terminal 225a can be electrically coupled to a first node 231 and the second output terminal 225b can be electrically coupled to a second node 232. The voltage source 225 is configured to supply a first voltage signal 221 across the first and second output terminals 225a, 225b. In non-limiting aspects, the first voltage signal 221 can supplied with respect to ground. The test system 220 can also include a current transformer 227, a first circuit 241 including a first set of switches 210a, a second circuit 242 including a second set of switches 210b, a set of sensors 260, a testing unit 280, and an electrically conductive enclosure 229. The set of sensors 260 can include a first current sensor 261, a second current sensor 262, a third current sensor 263. The first set of switches 210a can include a first switch 211 and a second switch 212. The second set of switches 210b can include a third switch 213, and a fourth switch 214.

The testing unit 280 can include a controller 285, a first test module 281, and a second test module 282. For example, in non-limiting aspects, the first test module 281 can be a conventional PD test module, configured to conduct a PD test of the electrical cable 250, and the second test module 282 can be a conventional EMI test module, configured to conduct an EMI test of the electrical cable 250.

The controller 285 can be a conventional controller having a processor, a memory, and a communications module The processor can be configured to perform a variety of computer-implemented functions and/or instructions (e.g., performing the methods, steps, calculations and the like and storing relevant data in the memory). The instructions, when executed by the processor can cause the processor to perform operations, as described herein. The controller 285 can be communicatively coupled to one or more of the voltage source 225, the first test module 281, or the second test module 282, or combinations thereof, and be configured to control a respective operation thereof. The controller 285 can be a system of controllers or a single controller. For example, in non-limiting aspects, the controller 285 can comprise a first control module 285a communicatively coupled to the first test module 281 and configured to control an operation of the first test module 281. In non-limiting aspects, the controller 285 can additionally or alternatively comprise a second control module 285b communicatively coupled to the second test module 282 and configured to control an operation of the second test module 282.

The testing unit 280 can include, or be communicatively coupled with, a user interface 290 such as a display or monitor. The user interface 290 can be in a remote location physically separate from the testing unit 280. The user interface 290 can include one or more knobs, dials, switches, displays, keypads, touch screens, monitors, and the like for communicating with a user, such as to receive input and provide output. The user can enter different types of information including, without limitation, a test selection, a voltage magnitude, a voltage frequency, a waveform, a duration, and the like. The testing unit 280 can be communicatively coupled to the voltage source 225 via a first communication line 226 and a second communication line 236. For example, the testing unit 280 can receive a status signal 226a via the first communication line 226 indicative of a value of the first voltage signal 221 from the voltage source 225. In non-limiting aspects, the value of the first voltage signal 221 can be indicative of a magnitude or a frequency, or both, of the first voltage signal 221. In non-limiting aspects, the testing unit 280 can provide a command signal 236a via the second communication line 236 to trigger the voltage source 225 to adjust or modify the first voltage signal 221.

The electrically conductive enclosure 229 defines an interior space 229a, and an exterior 229b. The interior space 229a is sized and arranged to operatively receive the shielded portion 258 of the electrical cable 250 therein. The conductive enclosure 229 can be electrically coupled to an electrical ground 230. The unshielded portion 257 of the electrical cable 250 can be disposed at the exterior 229b of the electrically conductive enclosure 229. The first electrically conductive shield 256 can be electrically coupled to the conductive enclosure 229.

In non-limiting aspects, the electrically conductive enclosure 229 can be a conventional altitude or hypobaric chamber. In such aspects, the conductive enclosure 229 can be configured to operably provide a controlled atmosphere which can be pressurized to simulate high altitudes (for example, from 50,000 to several hundred-thousand feet). For example, the conductive enclosure 229 can include a pressurizing module 219 and a chamber controller 219a. The pressurizing module 219 can include conventional vacuum pumps, valves, sensors, and the like configured to pressurize the atmosphere within the interior space 229a of the conductive enclosure 229 to a predetermined atmospheric pressure level. The controller 285 can be communicatively coupled to the testing unit 280 via a third communication line 218 and a fourth communication line 217. For example, the testing unit 280 can receive a status signal 218a from the chamber controller 219a via the third communication line 218 indicative of a value of an atmospheric pressure (e.g., 10 pounds per square inch) in the interior space 229a of the conductive enclosure 229. In non-limiting aspects, the testing unit 280 can provide a command signal 217a via the fourth communication line 217 to trigger the pressurizing module 219 to adjust or modify the atmospheric pressure level within the interior space 229a of the conductive enclosure 229.

The current transformer 227 can have an annular core 274 defining a bore 275, a primary winding 271 and a secondary winding 272. The primary winding 271 can be arranged as a conductive coil wound around a leg 274a of the annular core 274. The unshielded portion 257 of the electrical cable 250 is disposable through the bore 275. The electrically conductive element 252 at the first end 250a of the electrical cable 250 can be electrically coupled to the electrically conductive element 252 at the second end 250b of the electrical cable 250, for example via a lug or electrical connector 255, to form a loop or annular structure 250c. When so arranged, the electrical cable 250 can define the secondary winding 272 (e.g., a single-turn secondary winding).

The first circuit 241 can include a first leg 241a and a second leg 241b electrically coupled in series. The first leg 241a is electrically coupled to the voltage source 225. For example, the first leg 241a can be electrically coupled to the first output terminal 225a via a first node 231. The first leg 241a can be coupled electrically in series between the voltage source 225 and an upstream end of the primary winding 271. The first leg 241a can include the first switch 211. The first switch 211 is electrically coupled in series with the primary winding 271.

The first circuit 241 can include a second leg 241b electrically coupled in series between a downstream end of the primary winding 271 and the voltage source 225. For example, the second leg 241b can be coupled to the second output terminal 225b via a second node 232. The second leg 241b can include the second switch 212. The second switch 212 is electrically coupled in series with the primary winding 271. As illustrated, the first switch 211 and the second switch 212 can be arranged in a double-pole, single-throw configuration. In non-limiting aspects, the first and second switch 211, 212 can comprise any desired switching device (e.g., a MOSFET) capable of selective operation. The first circuit 241 selectively receives the first voltage signal 221 when the first set of switches 210a (e.g., the first and second switches 211, 212) are closed.

The second circuit 242 is arranged electrically in parallel with the first circuit 241. The second circuit 242 can include third leg 242a and a fourth leg 242b. The third leg 242a is electrically to the voltage source 225. For example, the third leg 242a can be coupled to the first output terminal 225a via the first node 231. The second leg 241b can be coupled electrically in series between the voltage source 225 and the secondary winding 272 (e.g., the electrically conductive element 252). The third leg 242a can include the third switch 213. The third switch is electrically coupled in series with the secondary winding 272.

The fourth leg 242b is electrically coupled in series between the electrically conductive enclosure 229 and the voltage source 225. For example, the fourth leg 242b can be coupled to the second output terminal 225b via the second node 232. The fourth leg 242b can include the fourth switch 214. The fourth switch 214 is electrically coupled in series with the second output terminal 225b and the electrically conductive enclosure 229. As illustrated, in non-limiting aspects, the third switch 213 and the fourth switch 214 can be arranged in a double-pole, single-throw configuration. In non-limiting aspects, the third and fourth switches 213, 214 can each comprise any desired switching device (e.g., a MOSFET) capable of selective operation. The second circuit 242 selectively receives the first voltage signal 221 when the second set of switches 210b (e.g., the third and fourth switches 213, 214) are closed.

An interlock device 215 can be coupled to the first set of switches 210a and the second set of switches 210b. The interlock device 215 interlocks the wherein the first set of switches 210a with the second set of switches 210b, such that only one of the first set of switches 210a or the second set of switches 210b is closed at a time. In non-limiting aspects, the testing unit 280 can be communicatively coupled to the first set of switches 210a, or the second set of switches 210b, or both, to selectively control a respective operation, actuation, or toggling thereof. For example, the testing unit 280 can be communicatively coupled to the first set of switches 210a, or the second set of switches, or both via a fifth communication line 222.

The first, second, and third current sensors 261, 262, 263 are communicatively coupled with the testing unit 280. In non-limiting aspects, the first, second, and third current sensors 261, 262, 263 can comprise respective current transformers such as HFCTs or a RFCTs.

The first current sensor 261 is configured to sense a first electrical current I1 flowing in a first direction in the electrically conductive element 252 at the unshielded portion 257 and to supply a first current sensor signal 261a indicative of a first value (e.g., a magnitude) of the first electrical current I1 to the testing unit 280.

The second current sensor 262 is configured to sense a second electrical current I2 through the second node 232 and to supply a second current sensor signal 262a indicative of a second value (e.g., a magnitude) of the second electrical current I2 to the testing unit 280.

The third current sensor 263 is configured to sense a third electrical current I3 flowing through the electrical cable 250 at the shielded portion 258 and to supply a third current sensor signal 263a indicative of a third value (e.g., a magnitude) of the third electrical current I3 to the testing unit 280. The third electrical current I3 sensed by the third current sensor 263 can be equal to a sum of the first electrical current I1 flowing in the first direction through the electrically conductive element 252, and a fourth electrical current I4 in the first electrically conductive shield 256 flowing in a second direction, opposite the first direction. For example, in some non-limiting instances, the fourth electrical current can be an induced electrical current resulting from an EMI event. In other non-limiting instances, the fourth electrical current I4 can be an electrical current pulse resulting from a PD event. The first test module 281 can be further communicatively coupled to the first current sensor 261, second current sensor 262, and third current sensor 263 to receive the first, second and third current sensor signals 261a, 262a, 263a, respectively.

In operation, aspects of the test system 220 can be arranged to sequentially conduct a set of tests, such as a set of acceptance tests, of the electrical cable 250. In non-limiting aspects, the set of tests can include a first test, and a second test. For example, in non-limiting aspects, the first test can be a PD test, and the second test can be an EMI test. Each test can include subjecting the electrical cable 250 to predetermined electrical (voltage, current, etc.) and/or environmental (e.g., pressure, temperature, etc.) conditions, and measuring performance characteristics of the electrical cable 250 (e.g., voltage, current, etc.). The measured performance characteristics can be compared to predetermined thresholds. The tests can be performed in accordance with commercial, industry, or military standards to determine acceptability of the electrical cable 250. Additionally, or alternatively, the tests can be customized, for example based on particular performance needs of an application. While aspects of the disclosure are described herein by way of example and for ease of description and understanding, in terms of EMI, PD, and temperature rise tests, aspects are not so limited, and aspects can be used to conduct other types or numbers of tests, and in any order or sequence, as desired.

For example, in an instance where the first test comprises a PD test of the electrical cable 250, the first switch 211 and second switch 212 can be toggled to an open or OFF condition, and the third switch 213 and fourth switch 214 can be toggled to a closed or ON condition. In this way, the first circuit 241 is not operative during the first test, and the second circuit 242 is arranged in an operative state. The voltage source 225 can be operated to provide the first voltage signal 221 at a predetermined magnitude and frequency (e.g., 1 kilovolt (kV) at 10 megahertz (MHz), respectively) to the second circuit 242. The voltage source 225 can be further operated to vary (e.g., incrementally increase) the magnitude (e.g., from 1 kV to 100 kV in 1000 volt increments) and frequency (e.g., from 10 MHz to 500 MHz in 10 MHz increments at each magnitude), of the first voltage signal 221. The voltage source 225 can provide an indication of the magnitude and frequency of the first voltage signal 221 to the first test module 281. The first test module 281 can continuously or periodically monitor the value of the first electrical current I1 corresponding to respective values of the first voltage signal 221. For example, the first test module 281 can determine the value of the first electrical current I1 based on the first current sensor signal 261a received from the first current sensor 261. Additionally, or alternatively, the first test module 281 can determine the value of the third electrical current I3 based on the third current sensor signal 263a received from the third current sensor 263.

In non-limiting aspects, the first test can include testing the electrical cable 250 at a controlled atmosphere, for example pressurized to a predetermined atmospheric pressure within the interior space 229a of the conductive enclosure 229. The testing unit 280 can determine the atmospheric pressure within the interior space 229a of the conductive enclosure 229 based on the status signal 218a. The testing unit 280 can be further configured to selectively trigger the pressurizing module 219 to adjust or modify the atmospheric pressure within the interior space 229a to a predetermined atmospheric pressure level, by supplying the command signal 217a to the chamber controller 219a.

In operation, depending on the magnitude and frequency of the first voltage signal 221, or the atmospheric pressure within the interior space 229a of the conductive enclosure 229, or a combination thereof, a partial discharge event may occur in the first electrically insulative layer 254 of the electrical cable 250. The partial discharge event can result in the fourth electrical current I4 to flow in the first electrically conductive shield 256, or a change in the value of the first electrical current I1, or both. The first test module 281 can further determine a difference between the first electrical current I1 and the third electrical current I3 indicative of a magnitude of the fourth electrical current I4. The first test module 281 can further correlate the value (e.g., magnitude and frequency) of the first voltage signal 221 with the determined value of the first electrical current I1, or the fourth electrical current I4 or both. In non-limiting aspects, the first test module 281 can still further correlate an atmospheric pressure within the interior space 229a of the conductive enclosure 229 with the determined value of the first electrical current I1, or the fourth electrical current I4 or both. The correlated values of the first voltage signal 221 or the atmospheric pressure, or both, and the first electrical current I1 or the fourth electrical current I4 or both can be compared with predetermined partial discharge thresholds to determine acceptability of the electrical cable 250 with respect to the PD test.

In a non-limiting instance where the second test comprises EMI test of the electrical cable 250, the first switch 211 and second switch 212 can be operated or toggled to a closed or ON condition, and the third switch 213 and fourth switch 214 can be toggled to an open or OFF condition. In this way, the first circuit 241 is operative during the first test, and the second circuit 242 is arranged in a non-operative state. The voltage source 225 can be operated to provide the first voltage signal 221 at a predetermined magnitude and frequency (e.g., 1 kilovolt (kV) at 10 megahertz (MHz), respectively) to the first circuit 241. This causes the first voltage signal 221 to be applied across the primary winding 271, which induces the first electrical current I1 to flow in the secondary winding 272, (i.e., the electrically conductive element 252). The voltage source 225 can provide an indication of the magnitude and frequency of the first voltage signal 221 to the second test module 282. The second test module 282 can continuously or periodically monitor the value of the first electrical current I1 corresponding to respective values of the first voltage signal 221. For example, the first test module 281 can determine the value of the first electrical current I1 based on the first current sensor signal 261a received from the first current sensor 261.

In non-limiting aspects, the second test can include testing the electrical cable 250 at a controlled atmosphere, for example at a predetermined atmospheric pressure within the interior space 229a of the conductive enclosure 229. The testing unit 280 can determine the atmospheric pressure within the interior space 229a of the conductive enclosure 229 based on the status signal 218a. The testing unit 280 can be further configured to selectively trigger the pressurizing module 219 to adjust or modify the atmospheric pressure within the interior space 229a to a predetermined atmospheric pressure level, by supplying the command signal 217a to the chamber controller 219a.

In operation, depending on the magnitude and frequency of the first electrical current I1, or the atmospheric pressure within the interior space 229a of the conductive enclosure 229, or combinations thereof, the first electrical current I1 can emit electromagnetic signals (e.g., conducted emissions), that induce or cause the fourth electrical current I4 to flow in the first electrically conductive shield 256. The second test module 282 can determine the value of the third electrical current I3 based on the third current sensor signal 263a received from the third current sensor 263. The second test module 282 can further determine a difference between the first electrical current I1 and the third electrical current I3 indicative of a magnitude of the fourth electrical current I4. The second test module 282 can correlate the value (e.g., magnitude and frequency) of the first voltage signal 221 with the determined value of the fourth electrical current I4. In non-limiting aspects, the second test module 282 can still further correlate the atmospheric pressure within the interior space 229a of the conductive enclosure 229 with the determined value of the first electrical current I1, or the fourth electrical current I4 or both. The correlated values of the first voltage signal 221 or the atmospheric pressure within the interior space 229a of the conductive enclosure 229, or both, and the first electrical current I1, or fourth electrical current I4, or both can be compared with predetermined EMI thresholds to determine acceptability of the electrical cable 250 with respect to the EMI test.

In non-limiting aspects, the sequence of tests can additionally or alternatively include a third test. For example, in non-limiting aspects, the third test can be a heat rise test. The third test can include subjecting the electrical cable 250 to predetermined electrical (voltage, current, etc.) and/or environmental (e.g., pressure, temperature, etc.) conditions, and measuring performance characteristics of the electrical cable 250 (e.g., temperature rise, etc.). The measured performance characteristics can be compared to predetermined thresholds. The third test can be performed in accordance with commercial, industry, or military standards to determine acceptability of the electrical cable 250. Additionally, or alternatively, the third test can be customized, for example based on particular performance needs of an application. While the third test is described herein by way of example and for ease of description and understanding, in terms of a temperature rise test, aspects are not so limited, and aspects can be used to conduct other types or numbers of tests, and in any order or sequence, as desired.

Figure 3:
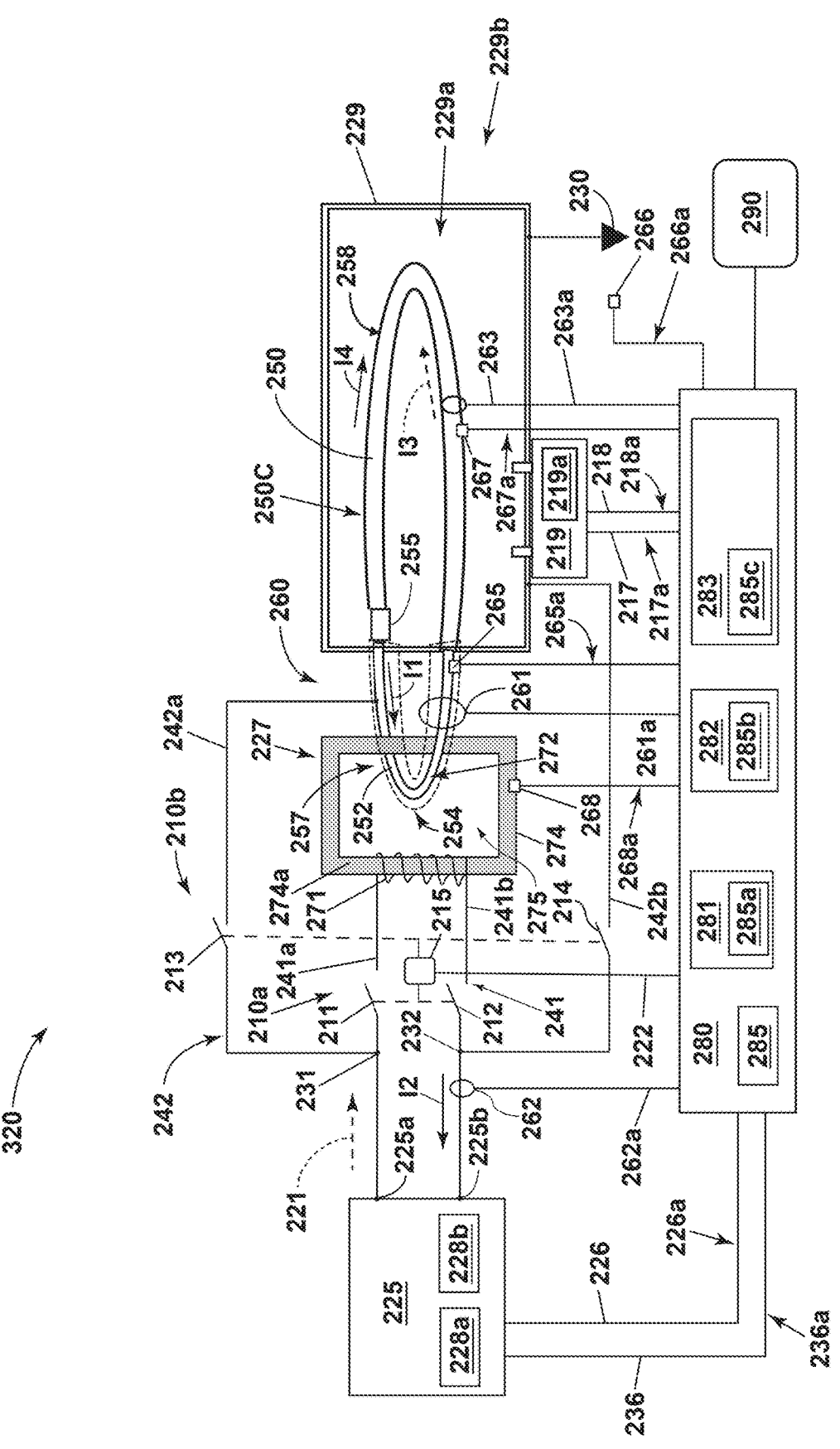
FIG. 3 is a schematic diagram of another exemplary testing system in accordance with aspects as described herein.

FIG. 3 depicts another exemplary test system 320 arranged to test an electrical cable 250 in accordance with a non-limiting aspect. The electrical cable 250 can be a conventional insulated shielded electrically conductive cable or wire. In non-limiting aspects, the electrical cable 250 can comprise the electrical cable 150 of any of FIG. 1A-1F. The test system 320 of FIG. 3 is similar to the test system 220 of FIG. 2, with one notable difference being that the testing unit 280 of the test system 320 includes a third test module 283. Another notable difference from the test system 220 of FIG. 2 is that in the non-limiting aspect of FIG. 3, the controller 285 can additionally or alternatively comprise a third control module 285c communicatively coupled to the third test module 283 and configured to control an operation of the third test module 283.

The first current sensor 261 is configured to sense the first electrical current I1 in the electrically conductive element 252 at the unshielded portion 257 and to supply a first current sensor signal 261a indicative of the first value (e.g., a magnitude) of the first electrical current I1 to the testing unit 280. The second current sensor 262 is configured to sense the second electrical current I2 through the second node 232 and to supply a second current sensor signal 262a indicative of the second value (e.g., a magnitude) of the second electrical current I2 to the testing unit 280.

As illustrated in FIG. 3, the set of sensors 260 can further include a first temperature sensor 265, a second temperature sensor 266, a third temperature sensor 267, and a fourth temperature sensor 268. In non-limiting aspects, the first, second third, and fourth temperature sensors 265, 266, 267, and 268 can comprise respective thermocouples. The first, second, third, and fourth temperature sensors 265, 266, 267, and 268 are communicatively coupled to the third test module 283.

The first temperature sensor 265 is configured to sense a first temperature of the electrically conductive element 252 (e.g., at the unshielded portion 257 of the electrical cable 250) and to supply a first temperature sensor signal 265a indicative of the first temperature of the electrically conductive element 252 to the third test module 283. The second temperature sensor 266 is configured to sense a second temperature of the ambient air proximal to the unshielded portion 257 of the electrical cable 250 and to supply a second temperature sensor signal 266a indicative of the second temperature of the ambient air to the third test module 283. The third temperature sensor 267 is configured to sense a third temperature of the first electrically conductive shield 256 of the current transformer 227 and to supply a third temperature sensor signal 267a indicative of the third temperature of the first electrically conductive shield 256 to the third test module 283. The fourth temperature sensor 268 is configured to sense a fourth temperature of the annular core 274 and to supply a fourth temperature sensor signal 268a indicative of the fourth temperature of the annular core 274 to the third test module 283. The third test module 283 is communicatively coupled to the first, second, third, and fourth temperature sensors 265, 266, 267, and 268 to receive the first, second, third, and fourth temperature sensor signals 265a, 266a, 267a, and 268a, respectively.

The third test module 283 can be configured to determine the first temperature of the electrically conductive element 252 (e.g., at the unshielded portion 257 of the electrical cable 250) and the second temperature of the ambient air proximal to the unshielded portion 257 of the electrical cable 250 and based on the first and second temperature sensor signals 265a, 266a, respectively. The third test module 283 can also be configured to determine a temperature rise of the unshielded portion 257 of the electrical cable 250 based on a comparison of the first and second temperature sensor signals 265a, 266a. The third test module 283 can be further configured to determine the third temperature of the first electrically conductive shield 256 based on the third temperature sensor signal 267a. The third test module 283 can also be configured to determine a temperature rise of the shielded portion 258 of the electrical cable 250 based on a comparison of the second and third temperature sensor signals 266a, 267a. The third test module 283 can be further configured to determine the fourth temperature of the annular core 274 based on the fourth temperature sensor signal 268a. The third test module 283 can also be configured to determine a temperature rise of the annular core 274 based on a comparison of the second and fourth temperature sensor signals 266a, 268a.

In one non-limiting instance where the third test comprises temperature rise test of the electrical cable 250, the first switch 211 and second switch 212 can be toggled to a closed or ON condition, and the third switch 213 and fourth switch 214 can be toggled to an open or OFF condition. In this way, the first circuit 241 is operative during the first test, and the second circuit 242 is arranged in a non-operative state. The voltage source 225 can be operated to provide the first voltage signal 221 at a predetermined magnitude and frequency (e.g., 3 kV at 10 megahertz (MHz), respectively) to the first circuit 241. This causes the first voltage signal 221 to be applied across the primary winding 271 which induces the first electrical current I1 to flow in the secondary winding 272, that is, the electrically conductive element 252.

The third test module 283 can determine the value of the first electrical current I1 corresponding to a value of the first voltage signal 221. For example, the first test module 281 can determine the value of the first electrical current I1 based on the first current sensor signal 261a received by the testing unit 280 from the first current sensor 261.

In non-limiting aspects, third test can optionally include testing the electrical cable 250 at a controlled atmosphere, for example at a predetermined atmospheric pressure within the interior space 229a of the conductive enclosure 229. The testing unit 280 can determine the atmospheric pressure within the interior space 229a of the conductive enclosure 229 based on the status signal 218a. The testing unit 280 can be further configured to selectively trigger the pressurizing module 219 to adjust or modify the atmospheric pressure within the interior space 229a to a predetermined atmospheric pressure level, by supplying the command signal 217a to the chamber controller 219a.

In operation, the third test module 283 monitors the second temperature of the electrically conductive element 252 (e.g., at the unshielded portion 257 of the electrical cable 250) based on the first temperature sensor signal 265a. The third test module 283 also monitors second temperature of the ambient air proximal to the unshielded portion 257 of the electrical cable 250 based on the second temperature sensor signal 266a. The third test module 283 further determines a difference between the first temperature and the second temperature, the difference being indicative of a first temperature rise (e.g., over the ambient temperature) of the electrical cable 250. The third test module 283 can correlate the difference between the first temperature and the second ambient temperature with the first electrical current I1.

In non-limiting aspects, the third test module 283 additionally monitors the third temperature of the first electrically conductive shield 256 based on the third temperature sensor signal 267a. The third test module 283 further determines a difference between the third temperature and the second temperature, the difference indicative of a second temperature rise (e.g., over the ambient temperature) of the shielded portion 258 of the electrical cable 250. The third test module 283 can correlate the difference between the third temperature and the second ambient temperature with the first electrical current I1.

In non-limiting aspects, the third test module 283 can further monitor the fourth temperature of the annular core 274 based on the fourth temperature sensor signal 268a. The third test module 283 can determine a difference between the third temperature and the second temperature, the difference indicative of a third temperature rise (e.g., over the ambient temperature) of the annular core 274. The third test module 283 can correlate the difference between the fourth temperature and the second ambient temperature with the first electrical current I1.

The third test module 283 can also correlate the value (e.g., magnitude and frequency) of the first voltage signal 221 with the determined first, second, and third temperature rise. In non-limiting aspects, the third test module 283 can still further correlate the atmospheric pressure within the interior space 229a of the conductive enclosure 229 with the determined first, second, and third temperature rise. The correlated values of the first voltage signal 221, the first electrical current I1, the atmospheric pressure within the interior space 229*a* of the conductive enclosure 229, or combinations thereof, and the first, second, and third temperature rise., or combinations thereof can be compared with predetermined temperature rise thresholds to determine acceptability of the electrical cable 250 with respect to the temperature rise test.

The disclosure discussed herein provides a solution for conducting multiple tests of a conductive cable. The fault detecting apparatus can detect and locate a failure in the wiring before there is significant energy loss and hence damage. Unlike conventional techniques, aspects as described herein can be implemented without need to repeatedly disconnect and reconnect the electrical cable under test from multiple test modules and instrumentation.

Aspects of this disclosure reduce workload of a maintenance and quality control personnel in determining the performance and/or acceptability of a conductive cable. Aspects of the disclosure discussed herein minimize the time and effort typically required to set up and conduct a sequence of tests.

To the extent not already described, the different features and structures of the various aspects may be used in combination with each other as desired. That one feature may not be illustrated in all of the aspects and is not meant to be construed that it may not be, but is done for brevity of description. Thus, the various features of the different aspects may be mixed and matched as desired to form new aspects, whether or not the new aspects are expressly described. All combinations or permutations of features described herein are covered by this disclosure.

This written description uses examples to disclose the subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure may also be embodied in any permutation of aspects of the disclosure, including but not limited to the following technical solutions as defined in the enumerated aspects:

A test system for testing an electrical cable having a first end and an opposing second end, and further having an electrically conductive element circumferentially surrounded by a first electrically insulative layer, the electrical cable further including an unshielded portion and a shielded portion including a first electrically conductive shield circumferentially surrounding the first electrically insulative layer, the first end electrically coupled to the second end to define a loop, the test system comprising: a voltage source configured to supply a first voltage signal; a current transformer having an annular core defining a bore, a primary winding, and a secondary winding, the primary winding being wound around a leg of the annular core, with the unshielded portion of the electrical cable being disposable through the bore to define the secondary winding; a first circuit having a first leg coupled to the voltage source via a first node and arranged electrically in series between the voltage source and an upstream end of the primary winding, the first leg having a first switch, the first circuit further including a second leg arranged in series between a downstream end of the primary winding and the voltage source via a second node, the second leg having a second switch, wherein the first circuit receives the first voltage signal when the first switch and the second switch are closed; an electrically conductive enclosure defining an interior space, arranged to operatively receive the shielded portion of the electrical cable within the interior space, the first electrically conductive shield being coupleable to the electrically conductive enclosure, the electrically conductive enclosure being couplable to an electrical ground; a second circuit coupled electrically in parallel with the first circuit, the second circuit coupled to the voltage source via the first node and arranged in series between the voltage source and the secondary winding, the second circuit including a third leg having a third switch, the second circuit further including a fourth leg arranged in series between the electrically conductive enclosure and the voltage source via the second node, the fourth leg including a fourth switch, wherein the second circuit receives the first voltage signal when the third switch and fourth switches are closed; a first current sensor configured to sense a first electrical current in the electrically conductive element at the unshielded portion of the electrical cable and to generate a first current sensor signal indicative of a first value of the first electrical current; a second current sensor configured to sense a second electrical current through the first node and to generate a second current sensor signal indicative of a second value of the second electrical current; a third current sensor configured to sense a third electrical current in the shielded portion of the electrical cable, and to generate a third current sensor signal indicative of a third value of the third electrical current, the third electrical current defined by a sum of the first electrical current and a fourth electrical current induced in the first electrically conductive shield; a testing unit comprising a first test module and a second test module, the testing unit communicatively coupled to the voltage source to receive a status signal indicative of a value of the first voltage signal therefrom, and further communicatively coupled to the first current sensor, the second current sensor, and the third current sensor to receive the first, second, and third current sensor signals respectively therefrom; wherein, when the third switch and the fourth switch are closed, the first test module is configured to determine the value of the first voltage signal, determine a magnitude of at least one of the first electrical current and the third electrical current, and to correlate the magnitude of the at least one of the first electrical current and the third electrical current with the value of the first voltage signal; and wherein, when the first switch and the second switch are closed, the second test module is configured to determine a difference between the first electrical current and the third electrical current and to correlate the magnitude of the at least one of the first electrical current and the third electrical current with the value of the first voltage signal.

The test system of any preceding clause, wherein the first switch and the second switch define a first set of switches, and the third switch and the fourth switch define a second set of switches, wherein the first set of switches are interlocked with the second set of switches, such that only one of the first set of switches or the second set of switches is closed at a time.

The test system of any preceding clause, wherein the first set of switches are arranged in a double-pole, single-throw configuration, and the second set of switches are arranged in a double-pole, single-throw configuration.

The test system of any preceding clause, wherein the testing unit is communicatively coupled to the first set of switches and the second set of switches to selectively control a respective operation thereof.

The test system of any preceding clause, wherein the value of the first voltage signal is defined by magnitude and a frequency.

The test system of any preceding clause, wherein the voltage source includes a signal generator communicatively coupled to an amplifier, the amplifier configured to selectively modify a voltage received from the signal generator to define the first voltage signal.

The test system of any preceding clause, wherein the electrically conductive enclosure comprises a hypobaric chamber.

The test system of any preceding clause, wherein the electrically conductive enclosure comprises a chamber controller communicatively coupled with the testing unit.

The test system of any preceding clause, wherein the interior space of the electrically conductive enclosure is selectively pressurized to a predetermined atmospheric pressure, and wherein, when the third switch and the fourth switch are closed, the first test module is further configured to correlate the magnitude of the at least one of the first electrical current and the third electrical current with the predetermined atmospheric pressure.

The test system of any preceding clause, wherein the interior space of the electrically conductive enclosure is pressurized to a predetermined atmospheric pressure, and wherein, when the first switch and the second switch are closed, the second test module is further configured to correlate the magnitude of the at least one of the first electrical current and the fourth electrical current with the predetermined atmospheric pressure.

The test system of any preceding clause, wherein the first test module is a partial discharge test module.

The test system of any preceding clause, wherein a partial discharge event at the first electrically insulative layer causes the fourth electrical current to flow in the first electrically conductive shield.

The test system of any preceding clause, wherein the second test module is an EMI test module.

The test system of any preceding clause, wherein the first electrical current induces the fourth electrical current in the first electrically conductive shield.

The test system of any preceding clause, wherein the electrical cable further includes a second electrically insulative layer circumferentially surrounding the electrically conductive element and circumferentially surrounded by the first electrically insulative layer, and wherein the shielded portion further includes a second electrically conductive shield circumferentially surrounding the second electrically insulative layer, the second electrically conductive shield circumferentially surrounded by the first electrically insulative layer.

The test system of any preceding clause, further comprising a first temperature sensor configured to sense a first temperature of the electrically conductive element and to supply a first temperature sensor signal indicative of the first temperature of the electrically conductive element; a second temperature sensor configured to sense a second ambient temperature proximal the electrical cable, and to supply a second temperature sensor signal indicative of the second ambient temperature; and wherein the testing unit further comprises a third test module communicatively coupled to the first and second temperature sensors to receive the first and second temperature sensor signals therefrom when the first switch and the second switch are closed, and further configured to determine the first temperature and the second ambient temperature.

The test system of any preceding clause, wherein the third test module is further configured to determine a difference between the first temperature and the second ambient temperature, and to correlate the difference between the first temperature and the second ambient temperature with the first electrical current.

The test system of any preceding clause, further comprising a third temperature sensor configured to sense a third temperature of the first electrically conductive shield, and to supply a third temperature sensor signal indicative of the third temperature; and wherein the third test module is communicatively coupled to the third temperature sensor to receive the third temperature sensor signal therefrom, determine the third temperature, and further configured to determine a difference between the third temperature and the second ambient temperature, and to correlate the difference between the third temperature and the second ambient temperature with the first electrical current.

The test system of any preceding clause, wherein the interior space of the electrically conductive enclosure is selectively pressurized to a predetermined atmospheric pressure, and wherein the third test module is further configured to correlate the magnitude of the first electrical current with the predetermined atmospheric pressure.

The test system of any preceding clause, further comprising a fourth temperature sensor configured to sense a fourth temperature of the annular core, and to supply a fourth temperature sensor signal indicative of the fourth temperature; and wherein the third test module is communicatively coupled to the fourth temperature sensor to receive the fourth temperature sensor signal therefrom, determine the fourth temperature, and further configured to determine a difference between the fourth temperature and the second ambient temperature, and to correlate the difference between the fourth temperature and the second ambient temperature with the first electrical current.

What is claimed is:

1. A test system for testing an electrical cable having a first end and an opposing second end, and further having an electrically conductive element circumferentially surrounded by a first electrically insulative layer, the electrical cable further including an unshielded portion and a shielded portion including a first electrically conductive shield circumferentially surrounding the first electrically insulative layer, the first end electrically coupled to the second end to define a loop, the test system comprising:

a voltage source configured to supply a first voltage signal;

a current transformer having an annular core defining a bore, a primary winding, and a secondary winding, the primary winding being wound around a leg of the annular core, with the unshielded portion of the electrical cable being disposable through the bore to define the secondary winding;

a first circuit having a first leg coupled to the voltage source via a first node and arranged electrically in series between the voltage source and an upstream end of the primary winding, the first leg having a first switch, the first circuit further including a second leg arranged in series between a downstream end of the primary winding and the voltage source via a second node, the second leg having a second switch, wherein the first circuit is configured to receive the first voltage signal when the first switch and the second switch are closed;

an electrically conductive enclosure defining an interior space, arranged to operatively receive the shielded portion of the electrical cable within the interior space, the first electrically conductive shield being coupleable to the electrically conductive enclosure, the electrically conductive enclosure being couplable to an electrical ground;

a second circuit coupled electrically in parallel with the first circuit, the second circuit coupled to the voltage source via the first node and arranged in series between the voltage source and the secondary winding, the second circuit including a third leg having a third switch, the second circuit further including a fourth leg arranged in series between the electrically conductive enclosure and the voltage source via the second node, the fourth leg including a fourth switch, wherein the second circuit is configured to receive the first voltage signal when the third switch and fourth switches are closed;

a first current sensor configured to sense a first electrical current in the electrically conductive element at the unshielded portion of the electrical cable and to generate a first current sensor signal indicative of a first value of the first electrical current;

a second current sensor configured to sense a second electrical current through the second node and to generate a second current sensor signal indicative of a second value of the second electrical current;

a third current sensor configured to sense a third electrical current in the shielded portion of the electrical cable, and to generate a third current sensor signal indicative of a third value of the third electrical current, the third electrical current defined by a sum of the first electrical current and a fourth electrical current induced in the first electrically conductive shield;

a testing unit comprising a first test module and a second test module, the testing unit communicatively coupled to the voltage source to receive a status signal indicative of a value of the first voltage signal therefrom, and further communicatively coupled to the first current sensor, the second current sensor, and the third current sensor to receive the first, second, and third current sensor signals respectively therefrom;

wherein, when the third switch and the fourth switch are closed, the first test module is configured to determine the value of the first voltage signal, determine a magnitude of at least one of the first electrical current and the third electrical current, and to correlate the magnitude of the at least one of the first electrical current and the third electrical current with the value of the first voltage signal; and wherein, when the first switch and the second switch are closed, the second test module is configured to determine a difference between the first electrical current and the third electrical current and to correlate the magnitude of the at least one of the first electrical current and the third electrical current with the value of the first voltage signal.

2. The test system of claim 1, wherein the first switch and the second switch define a first set of switches, and the third switch and the fourth switch define a second set of switches, wherein the first set of switches are interlocked with the second set of switches, such that only one of the first set of switches or the second set of switches is closed at a time.

3. The test system of claim 2, wherein the first set of switches are arranged in a double-pole, single-throw configuration, and the second set of switches are arranged in a double-pole, single-throw configuration.

4. The test system of claim 2, wherein the testing unit is communicatively coupled to the first set of switches and the second set of switches to selectively control a respective operation thereof.

5. The test system of claim 1, wherein the value of the first voltage signal is defined by magnitude and a frequency.

6. The test system of claim 1, wherein the voltage source includes a signal generator communicatively coupled to an amplifier, the amplifier configured to selectively modify a voltage received from the signal generator to define the first voltage signal.

7. The test system of claim 1, wherein the electrically conductive enclosure comprises a hypobaric chamber.

8. The test system of claim 7, wherein the electrically conductive enclosure comprises a chamber controller communicatively coupled with the testing unit.

9. The test system of claim 8, wherein the interior space of the electrically conductive enclosure is selectively pressurized to a predetermined atmospheric pressure, and wherein, when the third switch and the fourth switch are closed, the first test module is further configured to correlate the magnitude of the at least one of the first electrical current and the third electrical current with the predetermined atmospheric pressure.

10. The test system of claim 8, wherein the interior space of the electrically conductive enclosure is pressurized to a predetermined atmospheric pressure, and wherein, when the first switch and the second switch are closed, the second test module is further configured to correlate the magnitude of the at least one of the first electrical current and the fourth electrical current with the predetermined atmospheric pressure.

11. The test system of claim 1, wherein the first test module is a partial discharge test module.

12. The test system of claim 11, wherein a partial discharge event at the first electrically insulative layer causes the fourth electrical current to flow in the first electrically conductive shield.

13. The test system of claim 1, wherein the second test module is an EMI test module.

14. The test system of claim 13, wherein the first electrical current induces the fourth electrical current in the first electrically conductive shield.

15. The test system of claim 1, wherein the electrical cable further includes a second electrically insulative layer circumferentially surrounding the electrically conductive element and circumferentially surrounded by the first electrically insulative layer, and wherein the shielded portion further includes a second electrically conductive shield circumferentially surrounding the second electrically insulative layer, the second electrically conductive shield circumferentially surrounded by the first electrically insulative layer.

16. The test system of claim 1, further comprising:

a first temperature sensor configured to sense a first temperature of the electrically conductive element and to supply a first temperature sensor signal indicative of the first temperature of the electrically conductive element;

a second temperature sensor configured to sense a second ambient temperature proximal the electrical cable, and to supply a second temperature sensor signal indicative of the second ambient temperature; and wherein the testing unit further comprises a third test module communicatively coupled to the first and second temperature sensors to receive the first and second temperature sensor signals therefrom when the first switch and the second switch are closed, and further configured to determine the first temperature and the second ambient temperature.

17. The test system of claim 16, wherein the third test module is further configured to determine a difference between the first temperature and the second ambient temperature, and to correlate the difference between the first temperature and the second ambient temperature with the first electrical current.

18. The test system of claim 16, further comprising a third temperature sensor configured to sense a third temperature of the first electrically conductive shield, and to supply a third temperature sensor signal indicative of the third temperature; and wherein the third test module is communicatively coupled to the third temperature sensor to receive the third temperature sensor signal therefrom, determine the third temperature, and further configured to determine a difference between the third temperature and the second ambient temperature, and to correlate the difference between the third temperature and the second ambient temperature with the first electrical current.

19. The test system of claim 18, wherein the interior space of the electrically conductive enclosure is selectively pressurized to a predetermined atmospheric pressure, and wherein the third test module is further configured to correlate the magnitude of the first electrical current with the predetermined atmospheric pressure.

20. The test system of claim 16, further comprising a fourth temperature sensor configured to sense a fourth temperature of the annular core, and to supply a fourth temperature sensor signal indicative of the fourth temperature; and wherein the third test module is communicatively coupled to the fourth temperature sensor to receive the fourth temperature sensor signal therefrom, determine the fourth temperature, and further configured to determine a difference between the fourth temperature and the second ambient temperature, and to correlate the difference between the fourth temperature and the second ambient temperature with the first electrical current.

* * * * *